United States Patent
Camp, Jr. et al.

(10) Patent No.: US 8,185,066 B2
(45) Date of Patent: May 22, 2012

(54) MULTIMODE POWER AMPLIFIER WITH PREDISTORTION

(75) Inventors: William O. Camp, Jr., Chapel Hill, NC (US); William David Anderson, Chapel Hill, NC (US); David Story, Holly Springs, NC (US)

(73) Assignee: Sony Mobile Communications AB, Lund (SE)

( * ) Notice: Subject to any disclaimer, the term of this patent is extended or adjusted under 35 U.S.C. 154(b) by 292 days.

(21) Appl. No.: 12/604,854

(22) Filed: Oct. 23, 2009

(65) Prior Publication Data

US 2011/0098011 A1   Apr. 28, 2011

(51) Int. Cl.
*H04B 1/04* (2006.01)
(52) U.S. Cl. ..................... 455/114.3; 330/149
(58) Field of Classification Search .............. 455/114.1, 455/114.3, 115.1, 120, 127.1, 127.2, 127.3, 455/127.4; 375/295, 296; 330/36, 51, 149, 330/296
See application file for complete search history.

(56) References Cited

U.S. PATENT DOCUMENTS

| | | |
|---|---|---|
| 6,646,501 B1 | 11/2003 | Wessel |
| 2003/0107434 A1 | 6/2003 | Mitzlaff |
| 2006/0022751 A1 | 2/2006 | Fuller et al. |
| 2008/0136526 A1* | 6/2008 | Behzad et al. ............... 330/296 |
| 2009/0201084 A1* | 8/2009 | See et al. ................. 330/51 |
| 2009/0227215 A1 | 9/2009 | McCallister |

OTHER PUBLICATIONS

Notification of Transmittal of the International Search Report and the Written Opinion of the International Searching Authority, or the Declaration corresponding to PCT/US2010/049222, mailed Dec. 10, 2010, 9 pages.
International Preliminary Report on Patentability; Mar. 3, 2011; issued in International Patent Application No. PCT/US2010/049222.

* cited by examiner

*Primary Examiner* — Thanh Le
(74) *Attorney, Agent, or Firm* — Patrick B. Home; Moore & Van Allen, PLLC

(57) ABSTRACT

A device may include an envelope detector to generate an envelope signal from the input signal, a drain bias controller to adjust a drain bias of the amplifier based on the envelope signal, a gate bias controller to adjust a gate bias of the amplifier based on the envelope signal, a predistortion controller to predistort the input signal based on the envelope signal, based on the adjusted drain bias, and based on the adjusted gate bias, and to output the predistorted signal, and an amplifier to receive the predistorted signal and to generate an amplified output signal from the predistorted signal. The device may be selectable to operate in a linear mode or a nonlinear mode. The nonlinear mode may be selected by applying a large gate offset bias.

18 Claims, 13 Drawing Sheets

424 →

| ENVELOPE SIGNAL VALUES 510 | DRAIN BIAS 520 | GATE BIAS 530 | AMPLITUDE SHIFT 540 | PHASE SHIFT 550 |
|---|---|---|---|---|
| | ● | | | ● |
| | ● | | | ● |
| | ● | | | ● |

FIG. 5

MULTIMODE POWER AMPLIFIER WITH PREDISTORTION

BACKGROUND

Wireless communication between electronic devices is widespread and has many applications. An electronic device may need to amplify a signal before transmitting the signal to another electronic device. Signal amplification may be accomplished using a power amplifier. A power amplifier may take energy from a power supply and control an output signal to match an input signal waveform, but with a larger amplitude. Electronic devices, such as mobile phones, may use complex modulation schemes that include both amplitude and phase variations. These complex modulation schemes may exhibit high peak to average power ratios. For example, modulation schemes, such as Wideband Code Division Multiple Access (W-CDMA) and High-speed Downlink Packet Access (HSDPA), may have peak to average ratios of 3-4 decibels (dB) and newer standards, such as Long Term Evolution (LTE) may have peak to average ratios of 7 or more dB. Such high peak to average ratios may cause a power amplifier's efficiency to suffer greatly.

SUMMARY

According to one aspect, a device may include a drain bias controller to receive an envelope signal associated with an input signal and to adjust a drain bias based on the received envelope signal; a predistortion controller to predistort the input signal, based on the received envelope signal and based on the adjusted drain bias, and to output the predistorted signal; and an amplifier to receive the predistorted signal and to generate an amplified output signal from the predistorted signal, where the adjusted drain bias is associated with the amplifier.

Additionally, the device may include an envelope detector to generate the envelope signal from the input signal.

Additionally, the device may include a gate bias controller to adjust a gate bias of the amplifier based on the envelope signal, and the predistortion controller may further predistorts the input signal based on the adjusted gate bias.

Additionally, the amplifier may be selectable to be operated in a linear mode or in a nonlinear mode.

Additionally, the drain bias controller may include a first mode selector to receive a mode signal indicating whether the amplifier is to operate in the linear mode or the nonlinear mode and to cause the amplifier to operate according to the received mode signal, and the gate bias controller may include a second mode selector to receive the mode signal and to cause the amplifier to operate according to the received mode signal.

Additionally, the first mode selector and the second mode selector may cause the amplifier to operate in a nonlinear mode by applying an offset bias.

Additionally, the predistortion controller may predistorts the input signal by adjusting an amplitude of the input signal and a phase of the input signal.

Additionally, the predistortion controller may include a memory to store lookup tables; and a processor to adjust the amplitude and the phase of the input signal based on information stored in the lookup tables.

Additionally, the device may include a matching circuit to match an impedance of the amplifier with a load impedance associated with the amplified output signal.

Additionally, the matching circuit may further resonate a drain capacitance associated with the amplifier at an operating frequency of the amplifier, and where the matching circuit may include an electronically tunable variable capacitor to tune the matching circuit to the operating frequency of the amplifier.

Additionally, the amplifier may include one or more gallium nitride transistors.

Additionally, the device may include a radio frequency transceiver of a mobile communication device.

According to another aspect, a method may include receiving, using a communication interface of the electronic device, an input signal; receiving, using the communication interface, an envelope signal associated with the received input signal; adjusting, using the communication interface, a drain bias voltage of an amplifier associated with the communication interface, based on the envelope signal; generating, using the communication interface, a predistortion signal from the received input signal, based on the envelope signal and based on the adjusted drain bias voltage; amplifying, using the amplifier, the predistortion signal; and transmitting, using the communication interface, the amplified predistortion signal.

Additionally, the method may include adjusting, using the communication interface, a gate bias voltage based on the envelope signal; and where the generating the predistortion signal is further based on the adjusted gate bias voltage.

Additionally, generating the predistortion signal may include receiving the envelope signal, the adjusted drain bias voltage, and the adjusted gate bias voltage; determining an amplitude shift and a phase shift associated with the received envelope signal, the received adjusted drain bias voltage, and the received adjusted gate bias voltage; and applying the determined amplitude shift and the determined phase shift to the received input signal.

Additionally, determining the amplitude shift and the phase shift may include reading from a memory that associates the received envelope signal, the received adjusted drain bias voltage, and the received adjusted gate bias voltage with the amplitude shift and the phase shift.

Additionally, the method may include receiving a mode signal; and selecting an operating mode for the amplifier based on the mode signal.

Additionally, the mode signal may indicate whether the amplifier is to operate in a linear mode or in a nonlinear mode, and the method may further include determining that the amplifier is to operate in a nonlinear mode; and applying a gate offset bias to the amplifier, based on determining that the amplifier is to operate in the nonlinear mode.

Additionally, the gate offset bias may be −3 Volts.

According to yet another aspect, a system may include means for receiving an input signal; means for determining an envelope signal based on the received input signal; means for adjusting a drain bias voltage based on the envelope signal; means for adjusting a gate bias voltage based on the envelope signal; means for generating a predistortion signal from the received input signal, based on the envelope signal, based on the adjusted drain bias voltage, and based on the adjusted gate bias voltage; means for amplifying the predistortion signal; means for selecting whether the means for amplifying is to operate in a linear or a nonlinear mode by providing an offset via the means for adjusting the gate bias voltage; and means for transmitting the amplified predistortion signal.

BRIEF DESCRIPTION OF THE DRAWINGS

The accompanying drawings, which are incorporated in and constitute a part of this specification, illustrate one or more systems and/or methods described herein and, together with the description, explain these systems and/or methods. In the drawings:

FIG. 5 illustrates an exemplary data structure that may be stored in the memory of the predistortion controller depicted in FIG. 4;

DETAILED DESCRIPTION

Figure 1:
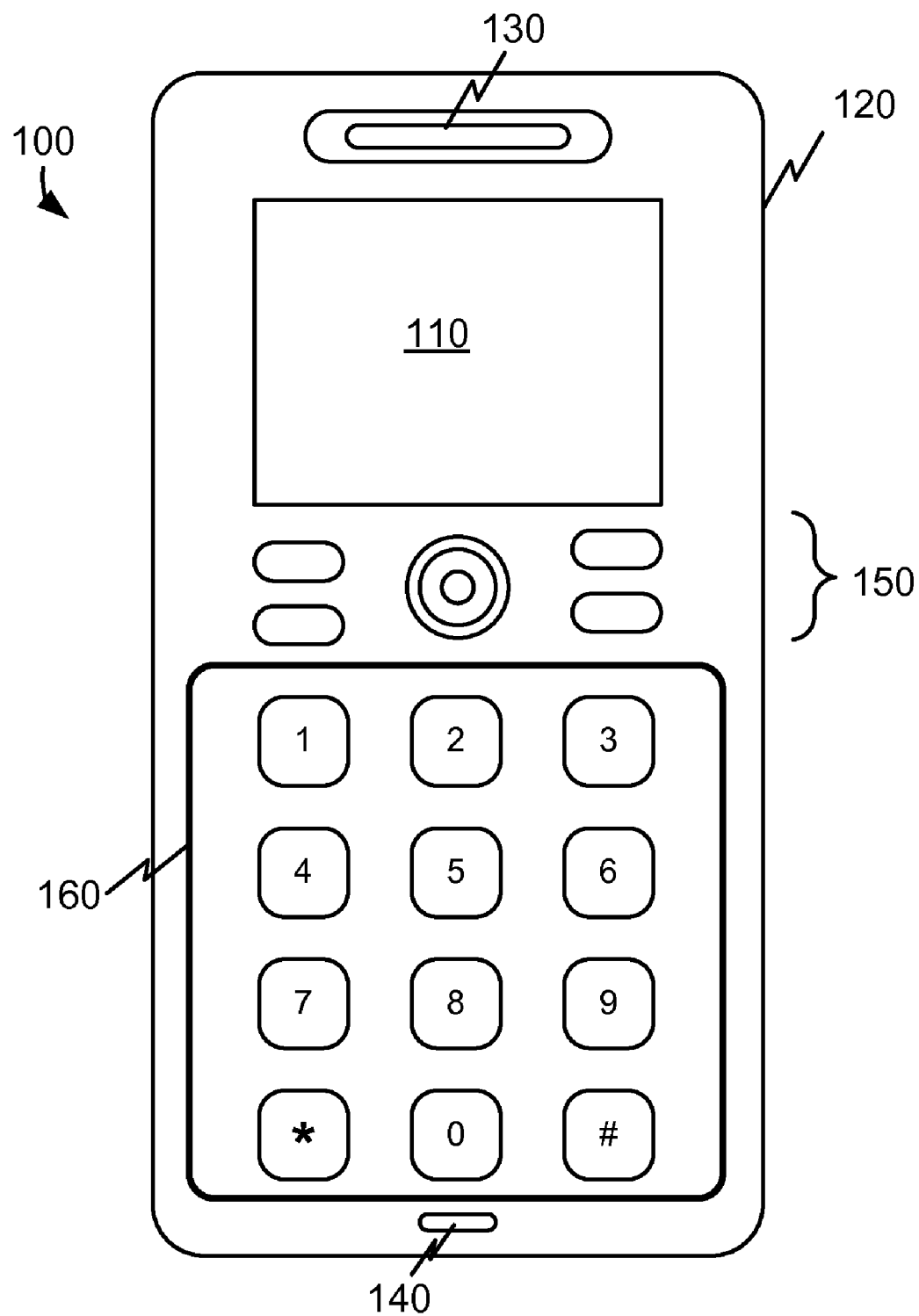
FIG. 1 is a diagram of an exemplary communication device in which systems and/or methods described herein may be implemented.

The following detailed description refers to the accompanying drawings. The same reference numbers in different drawings identify the same or similar elements. Also, the following detailed description does not limit the invention.

Exemplary implementations described herein may relate to a controlled carrier power amplifier with predistortion. Various circuits may be used to offset the efficiency degradation exhibited by power amplifiers when handling signals having a high peak to average power ratios. A typically power amplifier transfer curve may lose linearity at higher powers. One method to offset such non-linearity may include using feedback to linearize the signal when peaks of the signal extend into the nonlinear region of the amplifier transfer curve. This may require complex circuitry and may only be suitable for large base station amplifiers. Another method may include using predistortion to offset the nonlinearity when the power amplifier is operated in the nonlinear region, in order to keep the efficiency high. This method may be equivalent to an open loop compensation that may quickly become more detrimental than helpful if the compensation becomes misaligned with the nonlinearity of the amplifier.

A power amplifier may be implemented using one or more field effect transistors (FETs). A FET amplifier may respond to voltage such that the output current (i.e. the drain current) is based on $I_d = gm*V_g$, where $I_d$ is the output current in the drain, gm is the transconductance of the amplifier, and $V_g$ is the instantaneous voltage on the gate. The drain voltage may be based on $V_d = I_d*RL$, where $V_d$ is the drain voltage, $I_d$ is the drain current, and RL is the load resistance reflected in a matching circuit. The efficiency of an amplifier may be based on $Eff = P_{out}/P_{in} = (V^2_{peak}/2*RL)/(I_{gDC}*V_{gDC})$, where Eff is the efficiency, $P_{out}$ is the output power, $P_{in}$ is the input power, $V_{peak} = V_{dDC} - V_{dmin}$, where $V_{dDC}$ is the DC voltage at the drain and $V_{dmin}$ is the minimum voltage at the drain. It may be characteristic of the efficiency of an amplifier that it is high when $V_{dmin}$ is small relative to $V_{peak}$ (and $I_{dmin}$ is small relative to $I_{peak}$). Thus, waveforms with large changes in amplitude, which may be typical of signals with complex modulation, may result in an average output power that is much smaller than the peak output power. Furthermore, the DC input power may need to be much larger in order to maintain linearity in cases where upward or downward excursions of the peaks of the waveform occur. This may result in very inefficient utilization of an amplifier. The use of a drain bias controller, with or without a gate bias controller, may minimize such inefficient use of an amplifier.

Implementations described herein may relate to changing the DC drain bias voltage, or both the DC drain bias voltage and the DC gate bias voltage, of a power amplifier in response to the instantaneous power output required of the modulation waveform. The DC drain bias voltage and DC gate bias voltage may be set based on the envelope of an incoming input signal.

By varying the drain bias, and possibly also the gate bias, distortions may be introduced into the waveforms. This may be especially true if the rate of change in the drain (or in the drain and gate) bias voltages are rapid with respect to the Q factor of the matching circuit associated with the amplifier. The Q factor may be a measure of the under-damping of the matching circuit, and may represent the number of cycles it takes the matching circuit to respond.

The distortions may be a result of two causes. Distortions may result from passive circuit elements responding to changes in the DC bias levels. For example, it may take time for capacitors to adjust to a new voltage level, and decoupling capacitors may cause overshoot of the waveform in the direction of the DC bias movement. Distortions may also result from incidental phase shift and amplitude shift in the output of the amplifier in response to the changing DC bias voltages, also known as amplitude modulation (AM) to phase modulation (PM) shift or AM to AM shift. As an example, an increase in drain bias voltage may cause a drop in drain capacitance, which may in turn cause the output waveform to advance. As another example, changing DC bias on reactances of transistors may cause DC bias change. The distortions due to passive circuit response may be readily known (i.e. calculated), and the distortions due to incidental phase and modulation shift may be measured.

Implementations described herein may relate to a predistortion controller to take these distortions into account. The predistortion controller may change the phase of an incoming RF signal in response to an applied DC drain voltage bias, or in response to both an applied DC drain voltage bias and an applied DC gate voltage bias. Furthermore, the gain versus input level may be further changed to increase the linearization of the output signal of the amplifier in response the changing output transistor drain, or in response to the changing output transistor drain and gate bias. The predistortion controller may change the phase and amplitude of an input signal based on the envelope of the input signal and the applied drain bias voltage, or based on the envelope of the input signal and the applied drain bias voltage and the applied gate bias voltage. The use of a predistortion controller may further reduce the power consumption and increase the efficiency of a power amplifier.

Exemplary implementations described herein may additionally relate to a multi-mode amplifier. Mobile communication devices, such as cell phones, may support multiple cellular standards for communications. Different power amplifiers may be required for different standards in order to obtain optimum efficiency in each mode. Attempts to support more than one cellular standard in a single power amplifier, called a multi-mode power amplifier, may include a packaging effort to combine two or more different devices into one package, where each device is optimized for a specific mode. Using multiple dies in a single package may be expensive and take up too much space in a mobile communication device with limited real estate.

Attempts to support more than one cellular standard may include using a single device with a change in bias to attempt to recapture lost efficiency in a secondary mode. Simply changing the bias point of an output transistor may sacrifice efficiency in one mode for efficiency in another mode. Furthermore, if the output transistor is a field effect transistor (FET), changing the bias on the gate may only change whether the transistor is operating in a linear or nonlinear mode, but may not change the load seen by the transistor, which may be important for maintaining efficiency. Yet other attempts may include complicated schemes to change the load seen by the output transistor of the amplifier, to accommodate a change in mode of operation.

Another concern associated with power amplifiers may relate to operating voltage level. Amplifier devices may operate at the battery voltage level. Decreasing battery voltage levels may lead to inefficient operation of the output transistor and may lead to more difficult matching requirements.

Implementations described herein may additionally relate to setting drain voltage and gate bias of a power amplifier to appropriate values based on a required linearity and based on a required output power. Exemplary implementations described herein may take advantage of amplifiers based on gallium nitride (GaN) technologies. GaN may have a higher band-gap voltage than gallium arsenide (GaAs) based technologies, and may therefore be able to operate at higher voltages. This characteristic of GaN based amplifiers may permit GaN based amplifiers to operate at higher drain voltages, enabling realization of the implementations described herein.

Other aspects of the implementations described herein may include combining a higher drain voltage and a variable drain bias and gate bias to enable a broad band match to a nominal output impedance with minimal matching components for even more output efficiency. An output matching circuit may be tuned using a variable capacitor to cover large potential bandwidths.

Thus, using the implementations described herein, a single amplifier may be provided in a communication device (e.g. a mobile phone) for all modes, all power levels, and all frequencies required by the communication device.

EXEMPLARY DEVICES

FIG. 1 is a diagram of an exemplary mobile communication device 100 in which systems and/or methods described herein may be implemented. As shown, mobile communication device 100 may include a cellular radiotelephone with or without a multi-line display; a personal communications system (PCS) terminal that may combine a cellular radiotelephone with data processing, facsimile and data communications capabilities; a PDA that may include a radiotelephone, pager, Internet/Intranet access, Web browser, organizer, calendar and/or a global positioning system (GPS) receiver; a laptop and/or palmtop receiver; or other appliances that include a radiotelephone transceiver. Mobile communication device 100 may also include media playing capability. As described above, systems and/or methods described herein may also be implemented in other devices that require user input, with or without communication functionality.

Referring to FIG. 1, mobile communication device 100 may include a screen 110, a housing 120, a speaker 130, a microphone 140, control buttons 150, and a keypad 160.

Screen 110 may provide visual information to the user. Screen 110 may be a color display, such as a red, green, blue (RGB) display, a monochrome display or another type of display. Screen 110 may include a touch sensor display that may be configured to receive a user input when the user touches screen 110. For example, the user may provide an input to screen 110 directly, such as via the user's finger, or via other input objects, such as a stylus. User inputs received via screen 110 may be processed by components and/or devices operating in mobile communication device 100. The screen may permit the user to interact with mobile communication device 100 in order to cause mobile communication device 100 to perform one or more operations. In one exemplary implementation, screen 110 may include a liquid crystal display (LCD) display.

Housing 120 may include a structure that protects the components of mobile communication device 100 from outside elements. Housing 120 may include a structure configured to hold devices and components used in mobile communication device 100, and may be formed from a variety of materials. For example, housing 120 may be formed from plastic, metal, or a composite, and may be configured to support screen 110, speaker 130, microphone 140, control buttons 150, and keypad 160.

Speaker 130 may include a device that provides audible information to a user of mobile communication device 100. Speaker 130 may be located in an upper portion of mobile communication device 100, and may function as an ear piece when a user is engaged in a communication session using mobile communication device 100. Speaker 130 may also function as an output device for music and/or audio information associated with games, voicemails, and/or video images played on mobile communication device 100.

Microphone 140 may include a device that receives audible information from the user. Microphone 140 may include a device that converts speech or other acoustic signals into electrical signals for use by mobile communication device 100. Microphone 140 may be located proximate to a lower side of mobile communication device 100.

Control buttons 150 may include buttons or keys that permit the user to interact with mobile communication device 100 to cause mobile communication device 100 to perform one or more operations, such as place a telephone call, play various media, etc. For example, control buttons 150 may include a dial button, a hang up button, a play button, etc. Keypad 160 may include a telephone keypad used to input information into mobile communication device 100.

Although FIG. 1 shows exemplary components of mobile communication device 100, in other implementations, mobile communication device 100 may contain fewer, different, additional, or differently arranged components than depicted in FIG. 1. In still other implementations, one or more components of mobile communication device 100 may perform one or more tasks described below as being performed by one or more other components of communication device 100.

Figure 2:
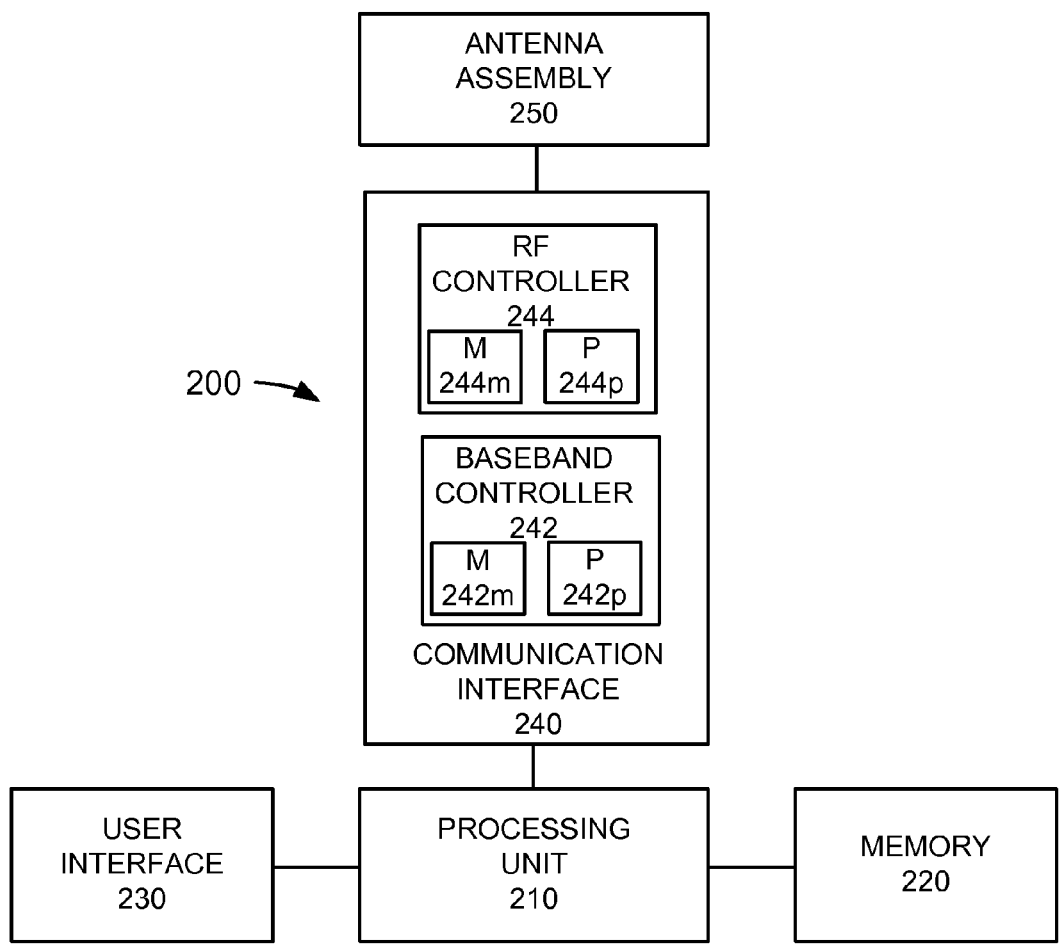
FIG. 2 is a diagram illustrating exemplary components of the mobile communication device of FIG. 1.

FIG. 2 is a diagram illustrating exemplary components of mobile communication device 100 of FIG. 1. As shown in FIG. 2, mobile communication device 200 may include a processing unit 210, a memory 220, a user interface 230, a communication interface 240, and an antenna assembly 250.

Processing unit 210 may include one or more processors, microprocessors, application specific integrated circuits (ASICs), field programmable gate arrays (FPGAs), or other types of processors that may interpret and execute instructions, programs, or data structures. Processing unit 210 may control operation of mobile communication device 100 and its components.

Memory 220 may include a RAM or another type of dynamic storage device that may store information and/or instructions for execution by processing unit 210; a ROM or another type of static storage device that may store static information and/or instructions for use by processing unit 210; a flash memory (e.g., an electrically erasable programmable read only memory (EEPROM)) device for storing information and/or instructions; and/or some other type of magnetic or optical recording medium and its corresponding drive.

User interface 230 may include mechanisms for inputting information to mobile communication device 100 and/or for outputting information from mobile communication device 100. Examples of input and output mechanisms might include a speaker to receive electrical signals and output audio signals; a camera lens to receive image and/or video signals and output electrical signals; a microphone to receive audio signals and output electrical signals; buttons (e.g., a joystick, control buttons, or keys of a keypad) to permit data and control commands to be input into mobile communication device 100; a display (e.g., a touch screen) to output visual information; and/or a vibrator to cause mobile communication device 100 to vibrate.

Communication interface 240 may include any transceiver-like mechanism that enables mobile communication device 100 to communicate with other devices and/or systems. For example, communication interface 240 may include a modem or an Ethernet interface to a local area network (LAN). In one implementation, for example, communication interface 340 may communicate with a network (e.g., a local area network (LAN), a wide area network (WAN), a telephone network, such as the Public Switched Telephone Network (PSTN), an intranet, the Internet, or a combination of networks).

Communication interface 240 may also include mechanisms for communicating via a wireless network. For example, communication interface 240 may include baseband controller 242 and radio frequency (RF) controller 244.

Baseband controller 242 may communicate with processing unit 210 and may prepare signals from processing unit 210 for transmission, and may receive signals and prepare the signals for use by processing unit 210. Baseband controller 242 perform functions related to modulation or demodulation, analog-to-digital or digital-to-analog conversion, encoding or decoding, encryption, or any other function related to signal transmission. In a particular implementation, baseband controller 242 may include a waveform generator. The waveform generator may include functionality to generate an envelope signal for a signal that is generated by baseband controller 242 for transmission (or for a signal that is received by baseband controller 242). Baseband controller 242 may be part of communication interface 240 or may be a separate integrated circuit. Baseband controller 242 may include a baseband processor 242p and a baseband memory 242m.

Baseband processor 242p may include one or more processors, microprocessors, ASICs, FPGAs, or other types of processors that may interpret and execute instructions, programs, or data structures. Baseband processor 242p may control operation of baseband controller 242 and its components.

Baseband memory 242m may include a RAM or another type of dynamic storage device that may store information and/or instructions for execution by baseband processor 242p; a ROM or another type of static storage device that may store static information and/or instructions for use by baseband processor 242p; a flash memory (e.g., an EEPROM) device for storing information and/or instructions; and/or some other type of magnetic or optical recording medium and its corresponding drive.

RF controller 244 may include a transmitter that may convert baseband signals from baseband controller 242 to radio frequency (RF) signals and/or a receiver that may convert RF signals to baseband signals. Alternatively, RF controller 244 may include a transceiver to perform functions of both a transmitter and a receiver. RF controller 244 may include one or more amplifiers for amplifying an RF signal prior to transmission and may connect to antenna assembly 250 for transmission and/or reception of the RF signals. Additionally, RF controller 244 may perform processing associated with signal amplification. RF controller 244 may include RF controller processor 244p and RF controller memory 244m.

RF controller processor 244p may include one or more processors, microprocessors, ASICs, FPGAs, or other types of processors that may interpret and execute instructions, programs, or data structures. RF controller processor 244a may control operation of RF controller 244 and its components.

RF controller memory 244m may include a RAM or another type of dynamic storage device that may store information and/or instructions for execution by RF controller processor 244p; a ROM or another type of static storage device that may store static information and/or instructions for use by baseband processor 242p; a flash memory (e.g., an EEPROM) device for storing information and/or instructions; and/or some other type of magnetic or optical recording medium and its corresponding drive.

Antenna assembly 250 may include one or more antennas to transmit and/or receive RF signals over the air. Antenna assembly 250 may, for example, receive RF signals from RF controller 244 and transmit them over the air and receive RF signals over the air and provide them to RF controller 244.

As described herein, mobile communication device 100 may perform certain operations in response to processing unit 210 (and/or baseband processor 242a and/or RF controller processor 244a) executing software instructions contained in a computer-readable medium, such as memory 220 (and/or baseband memory 242b and/or RF controller memory 244b). Such instructions may be read into memory 220 (and/or baseband memory 242b and/or RF controller memory 244b) from another computer-readable medium or another device via, for example, communication interface 240. A computer-readable medium may be defined as a physical or logical memory device. A logical memory device may include memory space within a single physical memory device or spread across multiple physical memory devices. The software instructions contained in memory 220 (and/or baseband memory 242b and/or RF controller memory 244b) may cause processing unit 210 (and/or baseband processor 242a and/or RF controller processor 244*a*) to perform processes that will be described later. Alternatively, hardwired circuitry may be used in place of or in combination with software instructions to implement processes described herein. Thus, implementations described herein are not limited to any specific combination of hardware circuitry and software.

Although FIG. 2 shows exemplary components of mobile communication device 100, in other implementations, mobile communication device 100 may contain fewer, different, additional, or differently arranged components than depicted in FIG. 2. In still other implementations, one or more components of mobile communication device 100 may perform one or more other tasks described as being performed by one or more other components of mobile communication device 100.

Figure 3A:
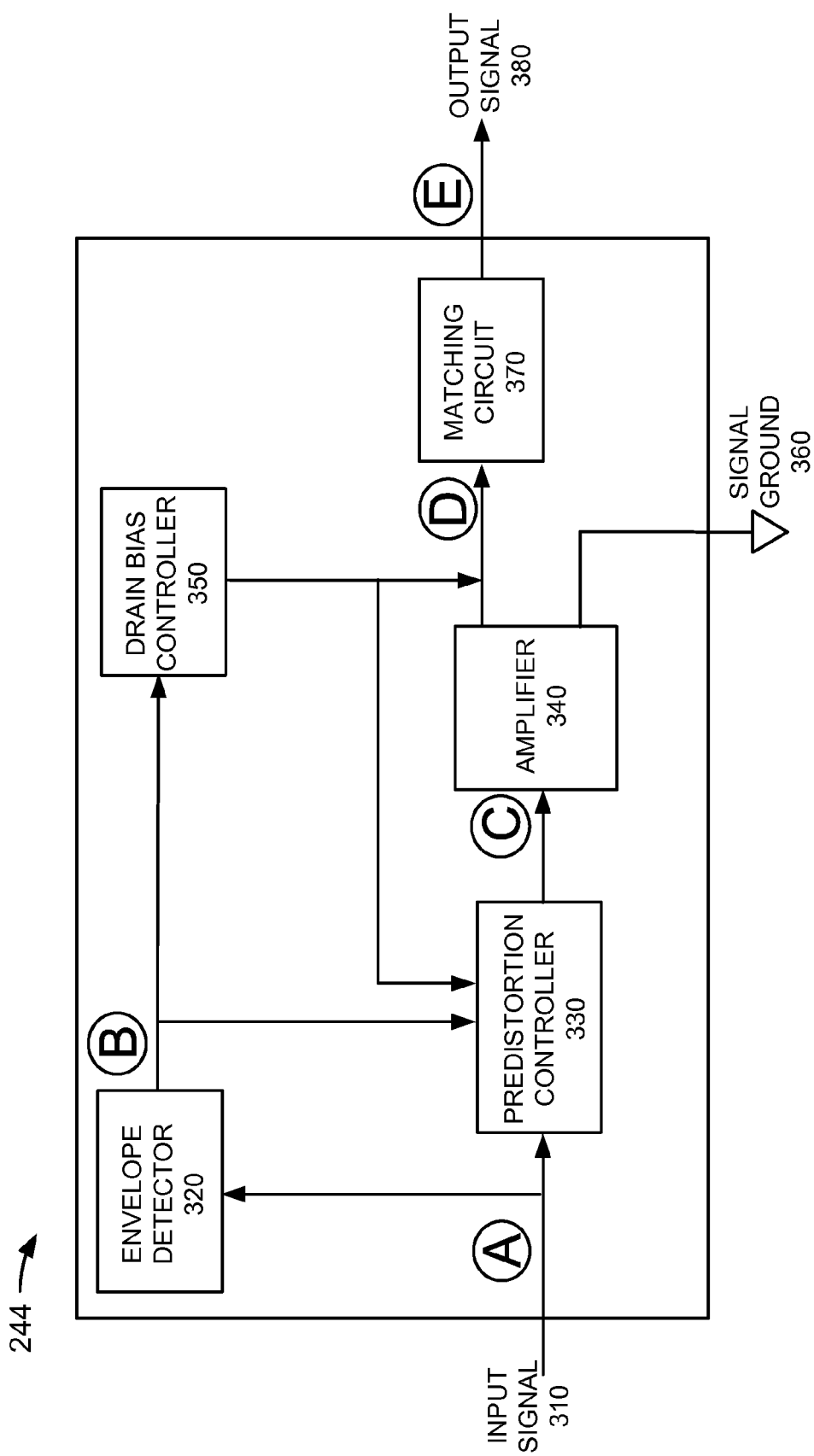
FIG. 3A is a diagram illustrating exemplary components of the radio frequency transmitter of FIG. 2 according to a first exemplary implementation.

FIG. 3A is a diagram illustrating exemplary components of the radio frequency transmitter of FIG. 2 according to a first exemplary implementation. FIG. 3A illustrates RF controller 244 implemented with a drain bias controller and a predistortion controller. In the implementation depicted in FIG. 3A, RF controller 244 may include an input signal 310, an envelope detector 320, a predistortion controller 330, an amplifier 340, a drain bias controller 350, a signal ground 360, a matching circuit 370, and an output signal 380.

Input signal 310 may be a signal received from another component of mobile communication device 100. Input signal 310 may be a digital signal or an analog signal. For example, a digital input signal may be received from baseband controller 242, in response to a user sending a text message, email message, or any other form of data. An analog input signal may originate, for example, from microphone 140. Input signal 310 may include a carrier signal that has undergone modulation and may exhibit a complex waveform with large amplitude variations.

Envelope detector 320 may receive input signal 310 and determine the envelope of input signal 310. The envelope may be thought of as an outline of a signal that connects all the peaks in the signal, thereby extracting amplitude information from the signal. The envelope may be obtained by rectification followed by filtering. In one implementation, envelope detector 320 may include one or more diode detectors, with or without a filter to filter out a DC component from the signal. In another implementation, envelope detector 320 may include one or more precision rectifiers, with or without a low-pass filter. Envelope detector 320 may include multiple detectors, where each detector may operate over a different amplitude range.

Predistortion controller 330 may receive input signal 310 and predisort the signal before the signal is amplified, to offset any distortions introduced into the signal by drain bias controller 350. Predistortion controller 330 may receive, as inputs, the envelope from envelope detector 320 and the drain bias from drain bias controller 350, and determine an amplitude shift and a phase shift based on the envelope and the drain bias. In one implementation, predistortion controller 330 may be implemented as a memory that stores lookup tables that associate envelope and drain bias values with amplitude and phase offset values and as a processor that accesses the lookup tables and adjusts an input signal based on the values in the lookup tables. In another implementation, predistortion controller 330 may be implemented as a hardwired circuit.

Amplifier 340 may receive the signal from predistortion controller 330 and amplify the signal. Amplifier 340 may include one or more transistors, such as field effect transistors (FETs). In an exemplary implementation, amplifier 340 may include a common source FET transistor. The common source FET transistor may receive the signal at the gate, and may output the amplifier signal at the drain. The common source FET transistor may modulate the drain bias based on signal at the gate, thereby amplifying the signal received at the gate.

Drain bias controller 350 may receive the envelope of input signal 310 from envelope detector 320 and adjust the drain bias of amplifier 340 based on the envelope. Adjusting the drain bias based on the envelope of input signal 310 may minimize the output signal with respect to the minimum output voltage, thereby improving the efficiency of the transistor of amplifier 340. Drain bias controller 350 may include one or more pass transistors. Additionally, or alternatively, drain bias controller 350 may include one or more voltage regulators.

Signal ground 360 may connect the signal ground to amplifier 340. In the exemplary implementation where amplifier 340 includes a common source FET, signal ground 360 may connect to the source of the FET.

Matching circuit 370 may match the impedance of amplifier 340 to an impedance of the load (i.e., the impedance seen by output signal 380). The impedance of the load may include, for example, the impedance of antenna assembly 250. Matching circuit 370 may act like a transformer, by converting an existing load impedance to a load impedance required by amplifier 340. In one implementation, matching circuit 370 may include an impedance bridging circuit. In other implementations, matching circuit 370 may include other circuits designed to match the impedance of amplifier 340 with an impedance of a load. Matching circuit 370 may also resonate any parasitic drain capacitance that may exist between the source and the drain of amplifier 340. Thus, matching circuit 370 may include an inductor to resonate the drain capacitance at the operating frequency. Matching circuit 370 may include a variable capacitor, which may allow matching circuit 370 to tune to the resonance frequency electronically.

Output signal 380 may be an amplifier version of input signal 310. Output signal 380 may be provided by RF controller 244 to antenna assembly 250.

Figure 3B:
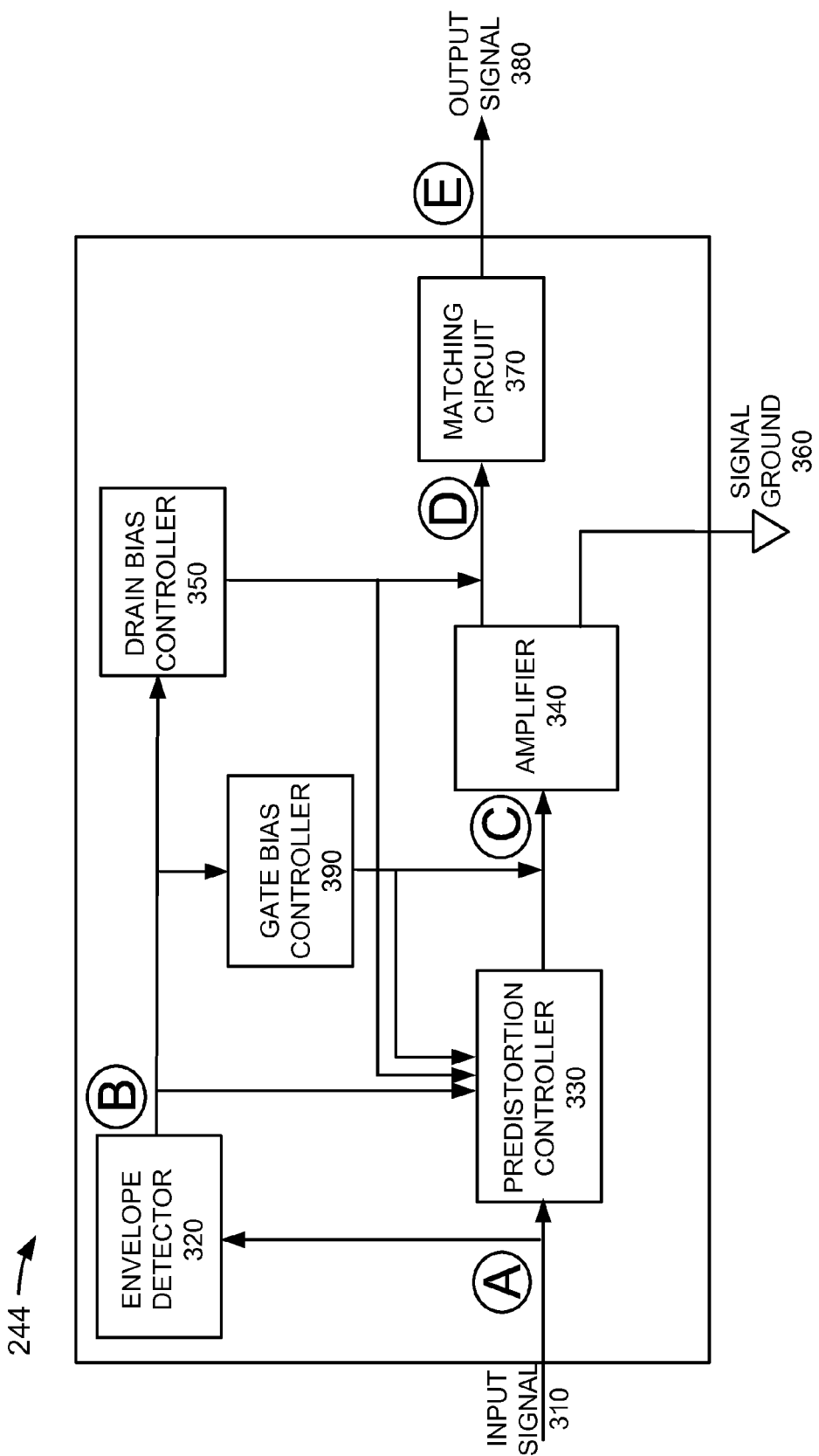
FIG. 3B is a diagram illustrating exemplary components of the radio frequency transmitter of FIG. 2 according to a second exemplary implementation.

FIG. 3B is a diagram illustrating exemplary components of the radio frequency transmitter of FIG. 2 according to a second exemplary implementation. FIG. 3B illustrates RF controller 244 implemented with a drain bias controller, gate bias controller, and a predistortion controller. The inclusion of a gate bias controller may further improve the efficiency of amplifier 340. In the implementation depicted in FIG. 3B, RF controller 244 may include input signal 310, envelope detector 320, predistortion controller 330, amplifier 340, drain bias controller 350, signal ground 360, matching circuit 370, output signal 380, and a gate bias controller 390. In the implementation depicted in FIG. 3B, envelope detector 320, predistortion controller 330, amplifier 340, drain bias controller 350, signal ground 360, and matching circuit 370 may function similarly to the implementation described above with respect to FIG. 3A.

Gate bias controller 390 may receive the envelope of input signal 310 from envelope detector 320 and adjust the gate bias of amplifier 340 based on the envelope. Adjusting the gate bias based on the envelope of input signal 310 may minimize the output signal with respect to the minimum output voltage, thereby improving the efficiency of the transistor of amplifier 340. Gate bias controller 390 may include one or more pass transistors. Additionally, or alternatively, gate bias controller 390 may include one or more voltage regulators.

In the implementation illustrated in FIG. 3B, predistortion controller 330 may, in addition to receiving as inputs the envelope of input signal 310 and the drain bias, receive the gate bias from gate bias controller 390. Predistortion controller 330 may determine an amplitude offset and a phase offset based on the envelope, the drain bias, and the gate bias.

Figure 3C:
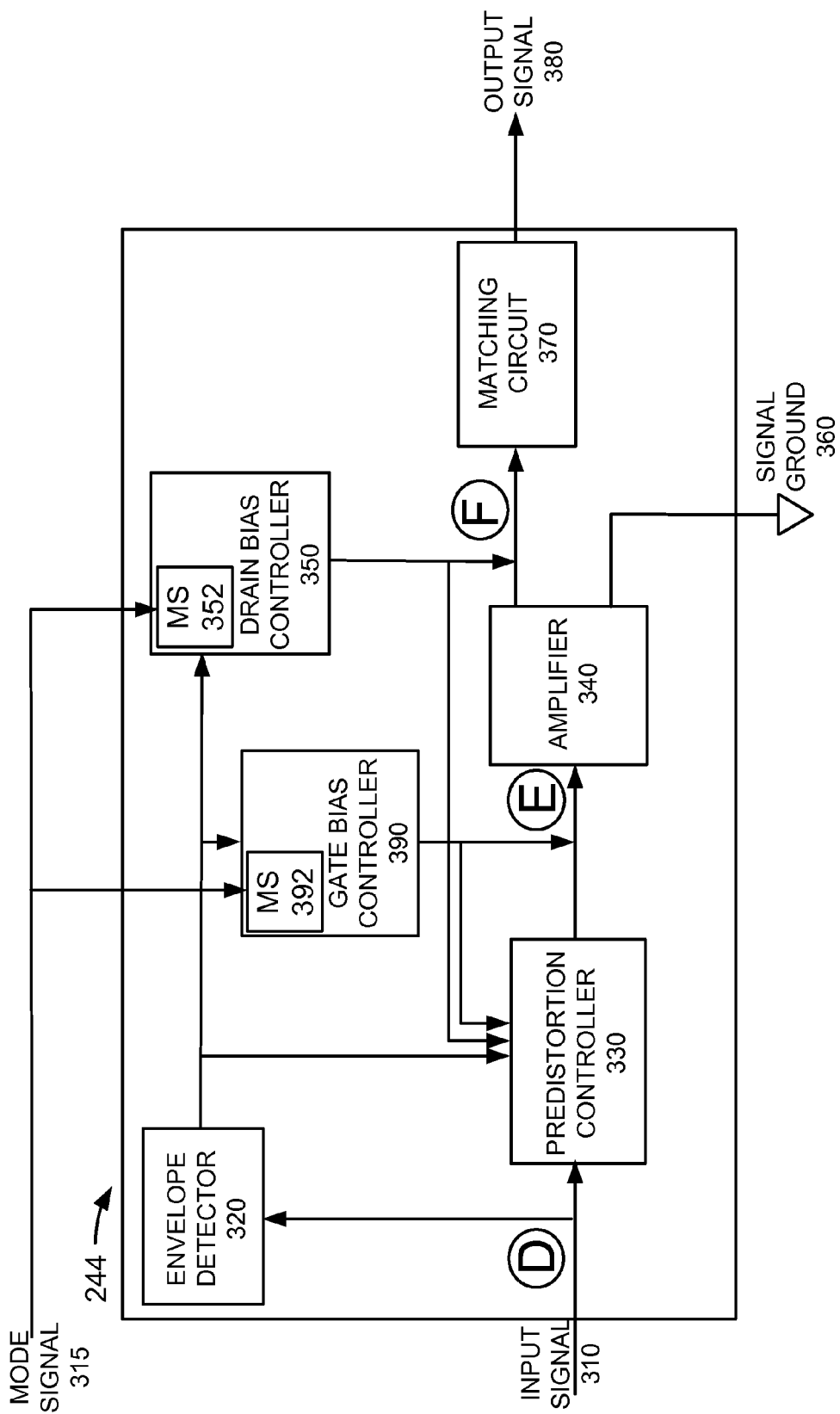
FIG. 3C is a diagram illustrating exemplary components of the radio frequency transmitter of FIG. 2 according to a third exemplary implementation.

FIG. 3C is a diagram illustrating exemplary components of the radio frequency transmitter of FIG. 2 according to a third exemplary implementation. FIG. 3C illustrates RF controller 244 implemented with a multi-mode amplifier. In the implementation depicted in FIG. 3C, RF controller 244 may include input signal 310, a mode signal 315, envelope detector 320, predistortion controller 330, amplifier 340, drain bias controller 350, signal ground 360, matching circuit 370, output signal 380, and gate bias controller 390. In the implementation depicted in FIG. 3B, envelope detector 320, predistortion controller 330, amplifier 340, drain bias controller 350, signal ground 360, matching circuit 370, and gate bias controller 390 may function similarly to the implementation described above with respect to FIG. 3B.

Mode signal 315 may include information indicating in which mode amplifier 340 should operate. In one implementation, mode signal 315 may indicate whether amplifier 340 should operate in linear mode or nonlinear mode. In other implementations, mode signal 315 may include information indicating amplifier 340 should operate in additional or different modes. In one implementation, mode signal 315 may be provided to RF controller 244 by baseband controller 242. In another implementation, mode signal 315 may be provided to RF controller 244 by another component of mobile communication device 100.

Drain bias controller 350 may include a mode selector 352. Mode selector 352 may receive mode signal 315 and set drain bias controller 350 to a mode based on information in mode signal 315. In an exemplary implementation, if mode signal 315 indicates that amplifier 340 should operate in a nonlinear mode, mode selector 352 may add a drain bias offset to the drain bias being generated by drain bias controller 350.

Gate bias controller 390 may include a mode selector 392. Mode selector 392 may receive mode signal 315 and set gate bias controller 390 to a mode based on information in mode signal 315. In an exemplary implementation, if mode signal 315 indicates that amplifier 340 should operate in a nonlinear mode, mode selector 392 may add a gate bias offset to the gate bias being generated by gate bias controller 390.

Including mode selector 352 and mode selector 392 may turn amplifier 340 into a multi-mode amplifier by changing the DC drain voltage and the gate bias conditions, while maintaining the same load impedance on the drain. In other words, matching circuit 370 may not need to be changed to support both modes. In one implementation, both mode selector 352 and mode selector 392 may be included in RF controller 244. In another implementation, only one of mode selector 352 and mode selector 392 may be included in RF controller 244.

Although FIGS. 3A-3C show exemplary components of RF controller 244, in other implementations, RF controller 244 may contain fewer, different, additional, or differently arranged components than depicted in FIGS. 3A-3C. In still other implementations, one or more components of RF controller 244 may perform one or more tasks described herein as being performed by one or more other components of RF controller 244. For example, in a particular implementation, envelope detector 420 may not be included in RF controller 244. Rather, baseband controller 242 (or another component of mobile communication device 100) may generate an envelope signal. For example, baseband controller 242 may include a digital waveform generator that may provide an envelope signal to RF controller 244.

Figure 4:
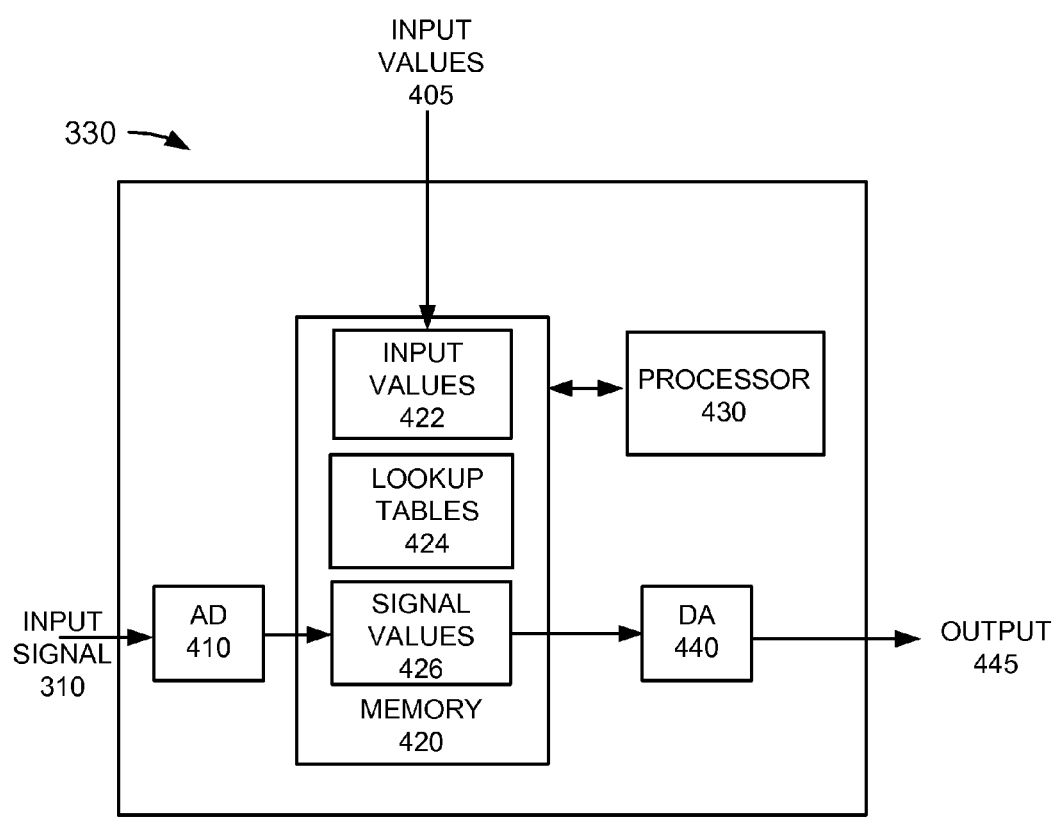
FIG. 4 is a diagram illustrating exemplary components of the predistortion controller of FIGS. 3A-3C.

FIG. 4 is a diagram illustrating exemplary components of the predistortion controller of FIGS. 3A-3C, implemented as a processor and a memory storing lookup tables. Predistortion controller 330 may include input values signal 405, signal input 310, an analog-to-digital (AD) converter 410, a memory 420, a processor 430, and a digital-to-analog (DA) converter 440, and an analog output signal 445.

Input values signal 405 may receive the input values used by predistortion controller 330 for adjusting input signal 310. Input values signal 405 may include the envelope of input signal 310 received from envelope detector 320, and a drain bias value received from drain bias controller 350. If gate bias controller 390 is implemented, input values signal 405 may include a gate bias value from gate bias controller 390.

As stated above, input signal 310 may be an analog signal or a digital signal. If input signal 310 is an analog signal, input signal 310 may be passed through AD converter 410. AD converter 410 may convert the analog signal to a digital signal for processing by other components of predistortion controller 330.

Memory 420 may include input values memory 422, lookup tables 424, and signal values memory 426. Input values memory 422 may store input values received via input values signal 405. For example, input values memory 422 may store one or more envelope values, a drain bias value, and a gate bias value. Lookup tables 424 may store one or more lookup tables that associate an amplitude offset and a phase offset with particular envelope values, drain bias values, and gate bias values. Signal values memory 426 may store one or more values associated with input signal 310. In one implementation, signal values memory 426 may store instantaneous values of input signal 310 (i.e., a current amplitude and/or phase of input signal 310). In another implementation, signal values memory 426 may store values of input signal 310 associated with a particular time interval (e.g., amplitude and/or phase of input signal 310 received over a few milliseconds).

Processor 430 may read values from input values memory 422, look up the values in lookup tables 424 to determine an amplitude offset and a phase offset, and apply the amplitude and phase offset to the signal values stored in signal values memory 426. Processor 430 may provide the adjusted signal values to DA converter 440. In one implementation, processor 430 may be implemented by RF controller processor 244m. In other implementations, processor 430 may be implemented by another processor associated with mobile communication device 100.

DA converter 440 may receive the adjusted digital signal and may convert the digital signal into analog output signal 445. Analog output signal 445 may be the input signal into amplifier 340.

There may not be any need for predistortion controller 330 to work faster than the Q factor of matching circuit 370, because when the predistortion controller 330 works at the speed of the Q factor, the granularity of the digital processing may not show up in the modulation of the signal. For example, assuming a carrier frequency of 2,000 MHz, and assuming a Q factor of 10 for matching circuit 370, matching circuit 370 may be smoothing over a period of 10 cycles, or 200 MHz. A typical modulation frequency may be 3.4 MHz, which may be much slower than the frequency of matching circuit 370. Thus, changes in the signal modulation may be slower than the frequency with which predistortion controller 330 may be updated.

Although FIG. 4 shows exemplary components of predistortion controller 330, in other implementations, predistortion controller 330 may contain fewer, different, additional, or differently arranged components than depicted in FIG. 4. In still other implementations, one or more components of predistortion controller 330 may perform one or more tasks described herein as being performed by one or more other components of predistortion controller 330. Although predistortion controller 330 has been illustrated as a processor and a memory storing lookup tables, in other implementations, predistortion controller 330 may be implemented differently. For example, predistortion controller 330 may be implemented as a hardwired circuit.

FIG. 5 illustrates an exemplary data structure (e.g., lookup tables 424) that may be stored in the memory of the predistortion controller depicted in FIG. 4. Lookup tables 424 ma include an envelope signal values field 510, a drain bias field 520, a gate bias field 530, an amplitude shift field 540, and a phase shift field 550.

Envelope signal values field 510 may store particular values of the envelope of an input signal. Drain bias field 520 may store particular drain bias values. Gate bias field 530 may store particular gate bias values. A particular combination of envelope values, drain values, and gate values may be associated with a particular amplitude shift and a particular phase shift. Amplitude shift field 540 may store an amplitude shift value associated with a particular combination of envelope, drain bias, and gate bias values. Phase shift field 550 may store a particular phase shift value associated with a particular combination of envelope, drain bias, and gate bias values. The amplitude and phase shift, for a particular combination of envelope, drain bias, and gate bias, may be obtained by calculation, measurement, or a combination of the two. For example, distortions due to the drain bias and gate bias changes as a result of changes in passive components may be calculated, while distortions due to incidental amplitude and phase shift as a result of drain bias and gate bias changes may be measured.

In one implementation, the values in amplitude shift field 540 and phase shift field 550 may be determined beforehand and set during manufacture of RF controller 244. In another implementation, the values in amplitude shift field 540 and phase shift field 550 may be determined during operation of mobile communication device 100. For example, RF controller 244 may periodically enter training mode and measure the amplitude and phase offset based on particular envelope, drain bias, and gate bias values, and may adjust lookup tables 524 based on the resulting measurements.

Although FIG. 5 shows exemplary data fields that may be stored in lookup tables 424, in other implementations, lookup tables 524 may contain fewer, different, additional, or differently arranged data fields than depicted in FIG. 5.

EXEMPLARY PROCESSES

Figure 6:
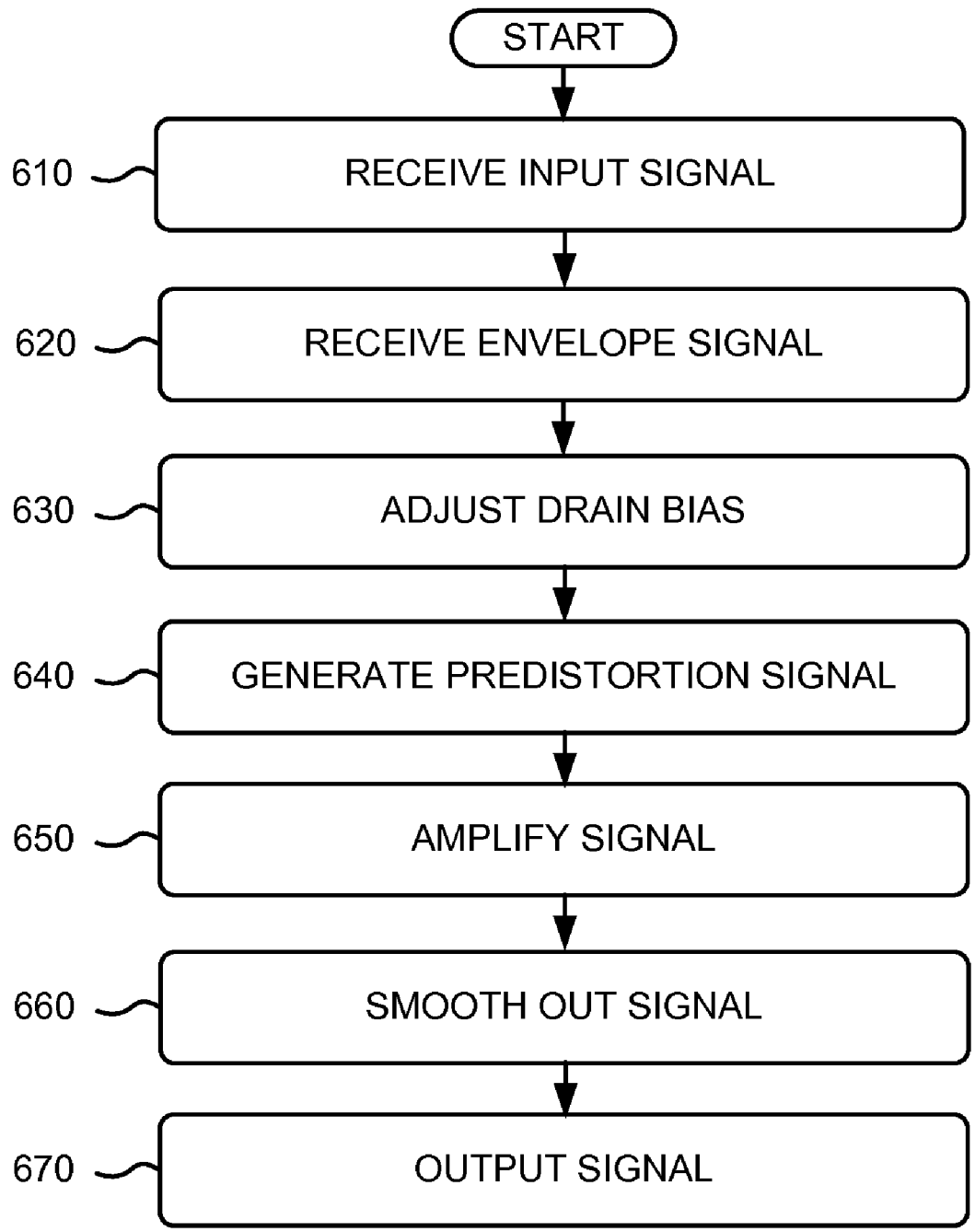
FIG. 6 illustrates a flow graph of a first exemplary process of amplifying a signal according to an implementation described herein.
Figure 10A:
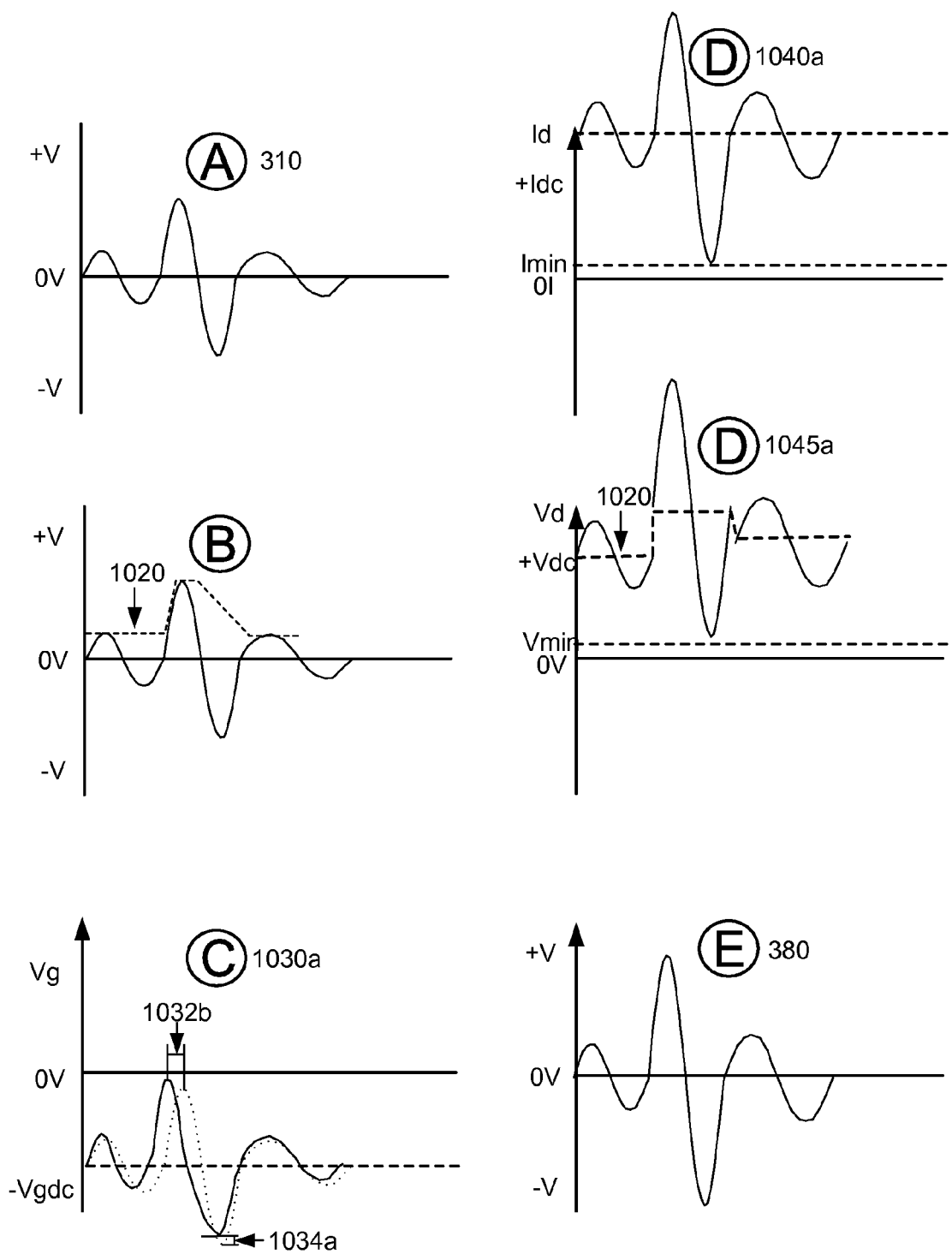
FIG. 10A is a diagram illustrating exemplary signal waveforms at particular points of the radio frequency transmitter illustrated in FIG. 3A.

FIG. 6 illustrates a flow graph of a first exemplary process of amplifying a signal according to an implementation described herein. In one implementation, the process of FIG. 6 may be performed by RF controller 244. In other implementations, some or all of the process of FIG. 6 may be performed by another device or group of devices. FIG. 10A is a diagram illustrating exemplary signal waveforms associated with the process illustrated in FIG. 6 and the device illustrated in FIG. 3A.

The process of FIG. 6 may include receiving an input signal (block 610). For example, predistortion controller 330 may receive input signal 310 from baseband controller 242, or from another component of mobile communication device 100 (e.g., microphone 140). Input signal 310 may include a waveform which may exhibit large changes in amplitude (see item A in FIG. 3A and FIG. 10A).

An envelope signal may be received (block 620). In one implementation, envelope detector 320 may generate envelope signal 1020 (FIG. 10A) from input signal 310 (see item B in FIG. 3A and FIG. 10A) and provide envelope signal 1020 for processing. Envelope signal 1020 may be used to vary the drain to minimize the signal with respect $V_{min}$ of the output of amplifier 340, thus maximizing efficiency of amplifier 340. In another implementation, envelope signal 1020 may be received from elsewhere. For example, envelope signal 1020 may be generated by a waveform generator in baseband controller 242 and envelope signal 1020 may be received from baseband controller 242.

Drain bias of an amplifier may be adjusted (block 630). For example, drain bias controller 350 may receive generated envelope signal 1020 and adjust the drain bias of amplifier 340 based on envelope signal 1020. If the envelope signal includes an increase in amplitude, drain bias controller 350 may increase the drain bias to match the increase in amplitude. If the envelope signal includes a decrease in amplitude, drain bias controller 350 may decrease the drain bias to match the decrease in amplitude (see item D in FIG. 3A and FIG. 10A).

A predistortion signal may be generated (block 640). For example, predistortion controller 330 may receive input signal 310 and generate a predistored signal. Predistortion controller 330 may generate the predistorted signal by receiving the generated envelope signal, the drain bias, and the gate bias, and generating an amplitude shift 1032a (FIG. 10A) and a phase shift 1032b (FIG. 10A) for input signal 310. Predistortion 310 may provide the predistorted signal to amplifier 340 (see item C in FIG. 3A and FIG. 10A).

The predistorted signal may be amplified (block 650). For example, amplifier 340 may receive the predistorted signal and generate amplified signal with current waveform 1040a (FIG. 10A) and voltage waveform 1045a (FIG. 10A). Amplifier 340 may include a common source FET and may receive the predistorted signal at the gate of the FET. The signal at the gate may modulate the applied drain bias, resulting in an amplified signal at the drain. Because of changes to the drain bias based on the generated envelope signal, the signal may be amplified without significant loss in the efficiency of the amplifier, even if the signal experiences large changes in amplitude.

The amplified signal may be smoothed out (block 660). For example, distortion circuit 370 may receive the amplified signal and smooth out the amplified signal to generate output signal 380 (see item E in FIG. 3A and FIG. 10A). The amplified signal may be outputted (block 670). For example, amplifier 340 may provide output signal 380 to antenna assembly 250 for wireless transmission.

Figure 7:
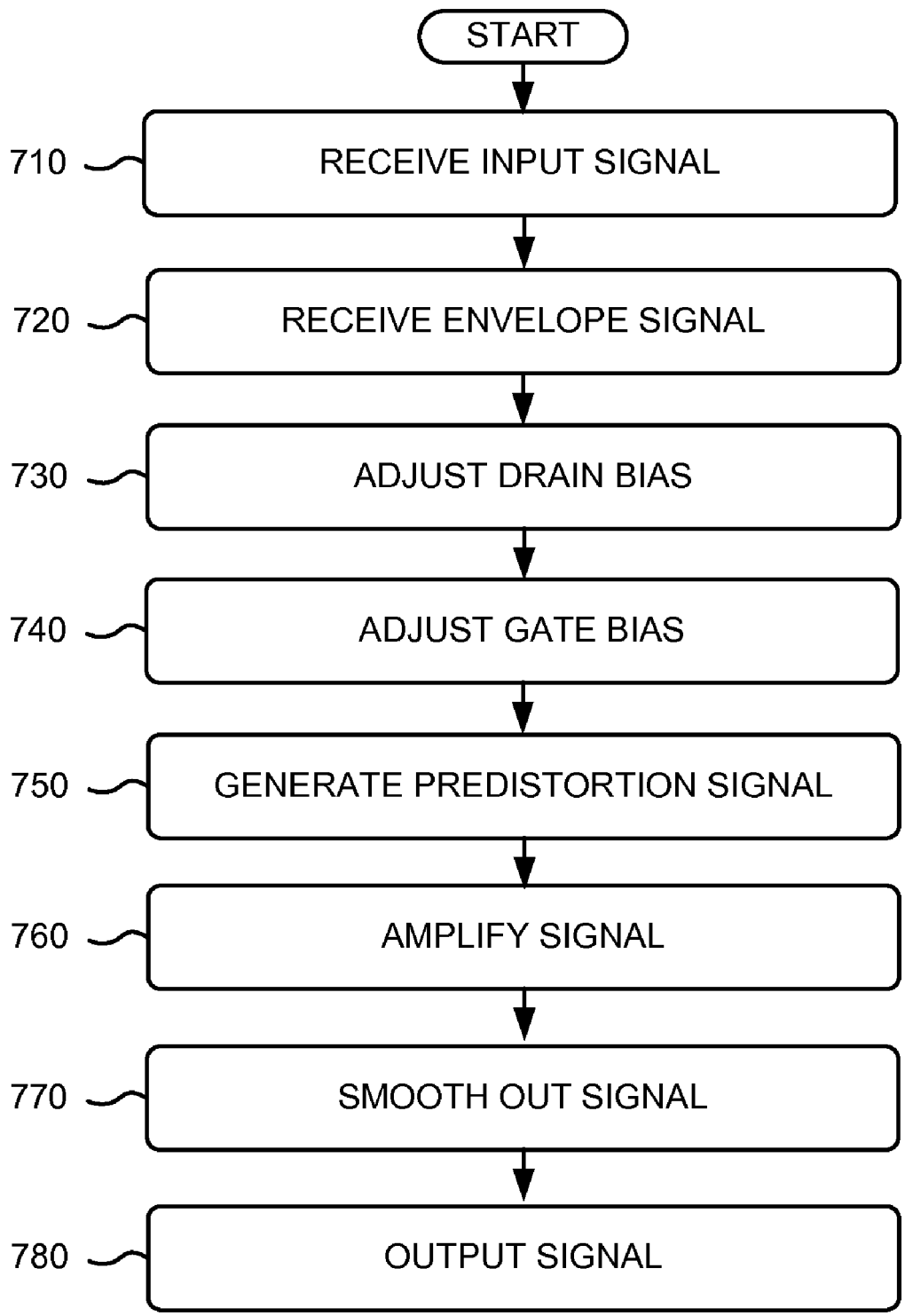
FIG. 7 illustrates a flow graph of a second exemplary process of amplifying a signal according to an implementation described herein.
Figure 10B:
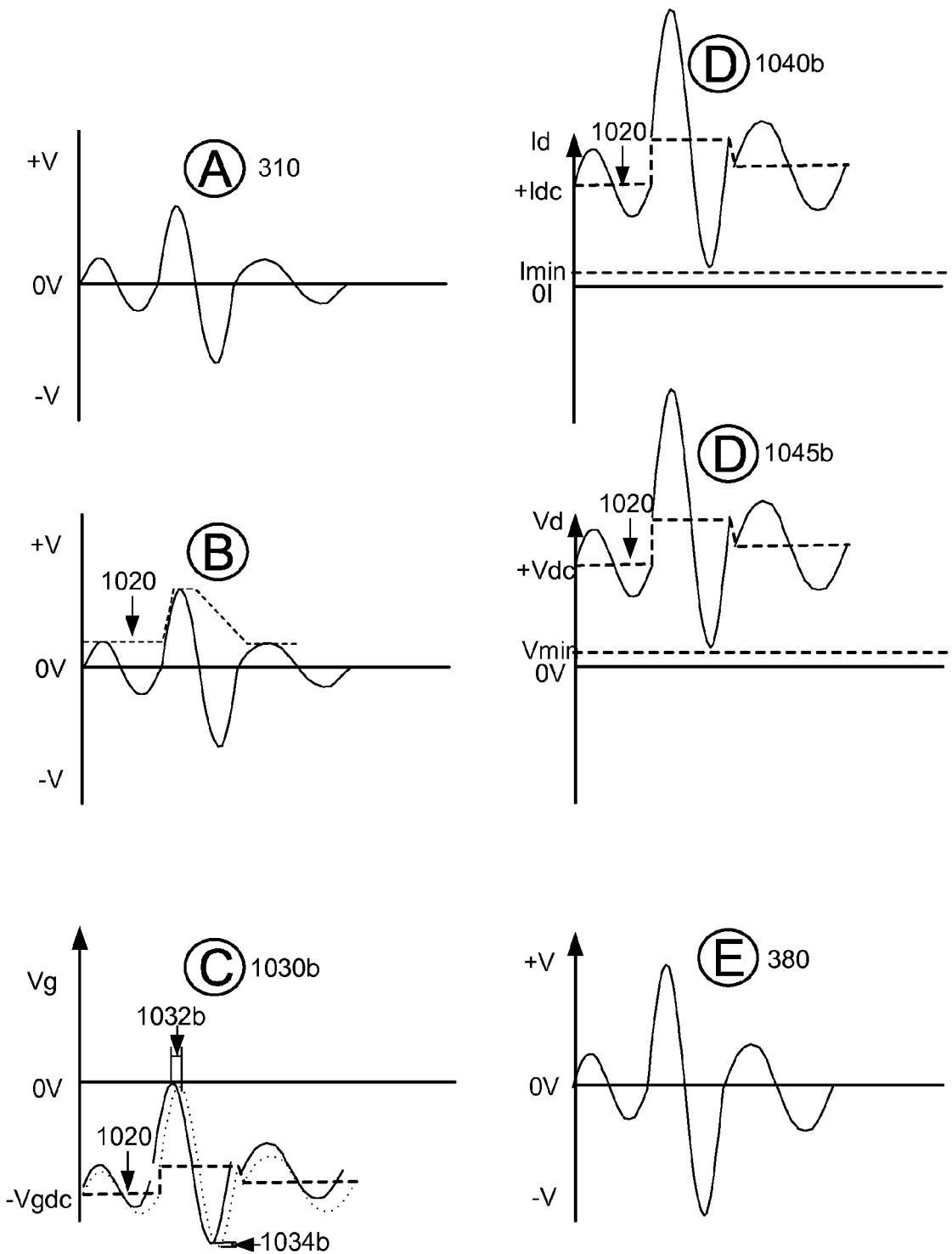
FIG. 10B is a diagram illustrating exemplary signal waveforms at particular points of the radio frequency transmitter illustrated in FIG. 3B.

FIG. 7 illustrates a flow graph of an exemplary process of amplifying a signal according to an implementation described herein. In one implementation, the process of FIG. 7 may be performed by RF controller 244. In other implementations, some or all of the process of FIG. 7 may be performed by another device or group of devices. FIG. 10B is a diagram illustrating exemplary signal waveforms associated with the process illustrated in FIG. 7 and the device illustrated in FIG. 3B.

The process of FIG. 7 may include receiving an input signal (block 710). For example, predistortion controller 330 may receive input signal 310 from baseband controller 242, or from another component of mobile communication device 100 (e.g., microphone 140). Input signal 310 may include a waveform which may exhibit large changes in amplitude (see item A in FIG. 3B and FIG. 10B).

An envelope signal may be received (block 720). In one implementation, envelope detector 320 may generate envelope signal 1020 (FIG. 10B) from input signal 310 (see item B in FIG. 3B and FIG. 10B) and provide envelope signal 1020 for processing. Envelope signal 1020 may be used to vary the drain to minimize the signal with respect $V_{min}$ of the output of amplifier 340, thus maximizing efficiency of amplifier 340. In another implementation, envelope signal 1020 may be received from elsewhere. For example, envelope signal 1020 may be generated by a waveform generator in baseband controller 242 and envelope signal 1020 may be received from baseband controller 242

Drain bias of an amplifier may be adjusted (block 730). For example, drain bias controller 350 may receive generated envelope signal 1020 and adjust the drain bias of amplifier 340 based on envelope signal 1020. If the envelope signal includes an increase in amplitude, drain bias controller 350 may increase the drain bias to match the increase in amplitude. If the envelope signal includes a decrease in amplitude, drain bias controller 350 may decrease the drain bias to match the decrease in amplitude (see item D in FIG. 3B and FIG. 10B).

Gate bias of an amplifier may be adjusted (block 740). For example, gate bias controller 390 may receive generated envelope signal 1020 and adjust the gate bias of amplifier 340 based on envelope signal 1020. If the envelope signal includes an increase in amplitude, gate bias controller 390 may increase the gate bias to match the increase in amplitude. If the envelope signal includes a decrease in amplitude, gate bias controller 390 may decrease the gate bias to match the decrease in amplitude (see item C in FIG. 3B and FIG. 10B).

A predistortion signal may be generated (block 750). For example, predistortion controller 330 may receive input signal 310 and generate a predistorted signal. Predistortion controller 330 may generate the predistorted signal by receiving the generated envelope signal, the drain bias, and the gate bias, and generating an amplitude shift 1032a (FIG. 10B) and a phase shift 1032b (FIG. 10B) for input signal 310. Predistortion 310 may provide the predistorted signal to amplifier 340 (see item C in FIG. 3B and FIG. 10B).

The predistorted signal may be amplified (block 760). For example, amplifier 340 may receive the predistorted signal and generate amplified signal with current waveform 1040a (FIG. 10B) and voltage waveform 1045a (FIG. 10B). Amplifier 340 may include a common source FET and may receive the predistorted signal at the gate of the FET. The signal at the gate may modulate the applied drain bias, resulting in an amplified signal at the drain. Because of changes to the drain bias based on the generated envelope signal, the signal may be amplified without significant loss in the efficiency of the amplifier, even if the signal experiences large changes in amplitude.

The amplified signal may be smoothed out (block 770). For example, distortion circuit 370 may receive the amplified signal and smooth out the amplified signal to generate output signal 380 (see item E in FIG. 3B and FIG. 10B). The amplified signal may be outputted (block 780). For example, amplifier 340 may provide output signal 380 to antenna assembly 250 for wireless transmission.

Figure 8:
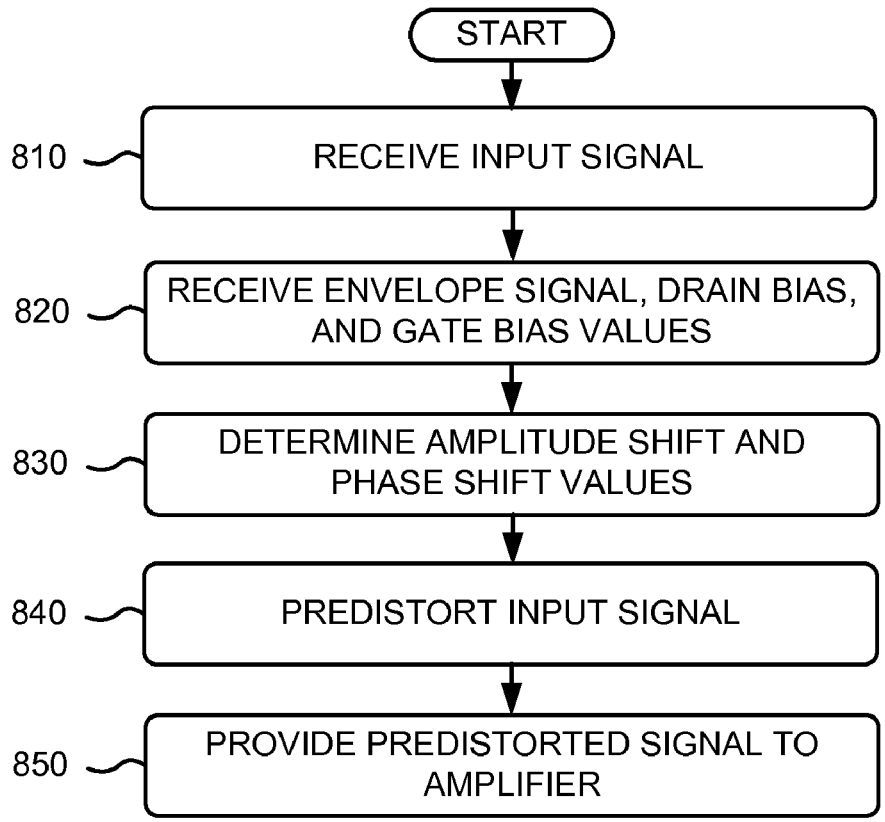
FIG. 8 illustrates a flow graph of an exemplary process of predistorting a signal according to an implementation described herein.

FIG. 8 illustrates a flow graph of an exemplary process of predistorting a signal according to an implementation described herein. In one implementation, the process of FIG. 8 may be performed by predistortion controller 330. In other implementations, some or all of the process of FIG. 8 may be performed by another device or group of devices.

The process of FIG. 8 may include receiving an input signal (block 810). For example, predistortion controller 330 may receive input signal 330 and store values associated with input signal 310 in signal values memory 526. The stored values may include amplitude and shift information associated with input signal 310. Envelope signal values, drain bias signal values, and gate bias signal values may be received (block 820). For example, predistortion controller 330 may receive input values 505 and store the input values in input values memory 522. Input values 505 may include values associated with the envelope generated from input signal 310, the drain bias generated by drain bias controller 350 based on the generated envelope, and the gate bias generated by gate bias controller 390 based on the generated envelope.

Amplitude shift and phase shift values may be determined (block 830). For example, processor 530 may read input values 505 from input value memory 522 and lookup up the amplitude shift and the phase shift associated with the input values in lookup tables 524.

The input signal may be predistorted (block 840). For example, processor 530 may apply the determined amplitude shift and phase shift values to the input signal values stored in signal values memory 526, by either adding or subtracting the amplitude and phase shift values to the signal values stored in signal values memory 526.

The predistorted signal may be provided to an amplifier (block 850). For example, processor 530 may provide the modified values from signal values memory 526 to DA converter 540. DA converter 540 may generate an analog signal and provide the analog signal to amplifier 340.

Figure 9:
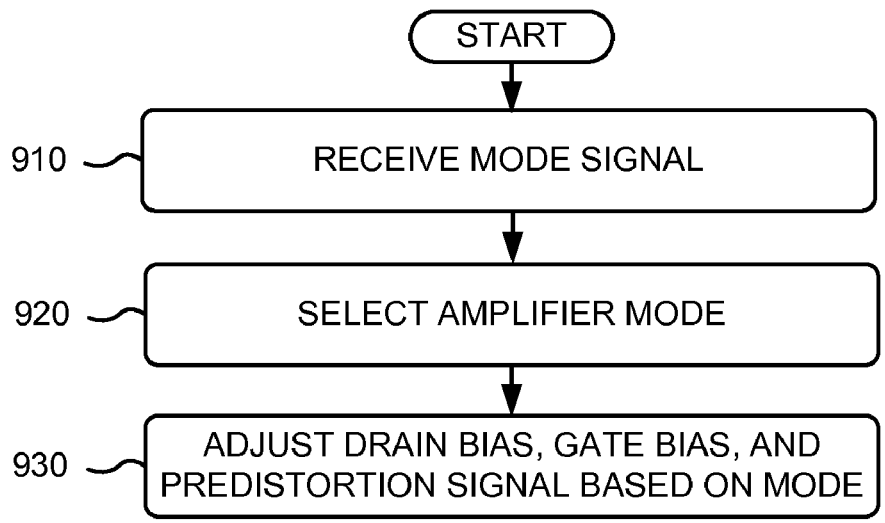
FIG. 9 illustrates a flow graph of an exemplary process of selecting an amplifier mode according to an implementation described herein.

FIG. 9 illustrates a flow graph of an exemplary process of selecting an amplifier mode according to an implementation described herein. In one implementation, the process of FIG. 9 may be performed by RF controller 244. In other implementations, some or all of the process of FIG. 9 may be performed by another device or group of devices.

The process of FIG. 9 may include receiving a mode signal (block 910). For example, baseband controller processor 242m may determine in what mode amplifier 340 is to operate. As an example, a first modulation scheme may require that amplifier 340 operate in a linear mode and a second modulation scheme may require that amplifier 340 operate in a nonlinear mode. Baseband controller processor 242m may send mode signal 315 to RF controller 244, informing RF controller in what mode amplifier 340 should operate.

An amplifier mode may be selected (block 920). For example, mode selector 352 in drain bias controller 350 and mode selector 392 in gate bias controller 390 may determine a mode for amplifier 340 based on mode signal 315 and may select an amplifier mode. In one exemplary implementation, mode selectors 352 and 392 may select either a linear mode or a nonlinear mode.

Drain bias, gate bias, and predistortion signals may be adjusted based on the selected mode (block 930). For example, if a nonlinear mode is selected, mode selector 352 may generate a drain bias offset and mode selector 392 may generate a gate bias offset. In response to the generate drain bias offset and the generated gate bias offset, predistortion controller 330 may predistort input signal 310 to offset distortions generated by the drain bias offset and the generated gate bias offset. In a nonlinear mode, the gate bias offset and the drain bias offset may lead to significantly higher drain bias and gate bias voltages. Predistortion controller 330 may include, in lookup tables 424, amplitude and phase shift values associated with drain bias and gate bias voltages during operation of amplifier 340 in nonlinear mode.

Figure 10C:
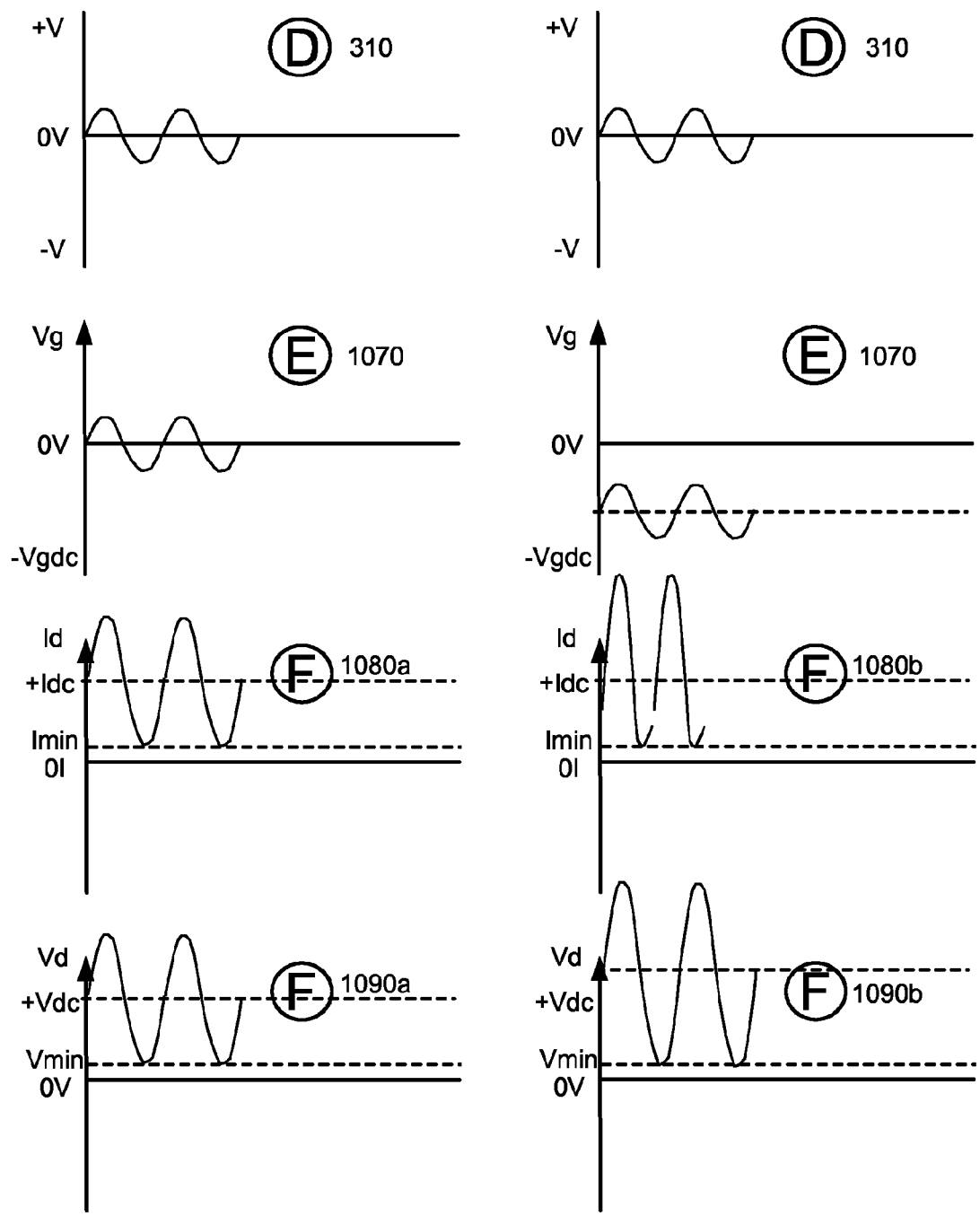
FIG. 10C is a diagram illustrating exemplary signal waveforms at particular points of the radio frequency transmitter illustrated in FIG. 3C.

FIG. 10C is a diagram illustrating exemplary signal waveforms associated with the process illustrated in FIG. 9 and the device illustrated in FIG. 3C. For the sake of simplicity, effects of envelope signal 1020 and the amplitude and phase offset generated by predistortion controller 330 are omitted from FIG. 10C.

The left column of FIG. 10C illustrates exemplary waveforms associated with a linear mode, and the right column of FIG. 10C illustrates exemplary waveforms associated with a nonlinear mode. Item D illustrates input signal 310 entering RF controller 244. In the left column of FIG. 10A, item E illustrates gate signal 1070a when amplifier 340 operates in linear mode. In the right column of FIG. 10C, item E illustrate gate signal 1070b when amplifier 340 operates in nonlinear mode, in which a large DC gain offset has been applied.

In a linear mode, amplifier 340 may generate linear current waveform 1080a and linear voltage waveform 1090a (see item F in FIG. 3C, and item F in the left column of FIG. 10C). In a nonlinear form, amplifier 340 may generate nonlinear current waveform 1080b and nonlinear current waveform 1090b (see item F in FIG. 3C, and item F in the right column of FIG. 10C). As the gate bias has been set to a large negative value in the nonlinear mode, amplifier 340 may be off for longer during an RF period, which may cause drain current $I_d$ to become very nonlinear. The shape of nonlinear voltage waveform 1090b may be similar to linear voltage waveform 1090a, yet with a larger peak voltage.

Table 1 below illustrates exemplary amplifier parameters that may be associated with a linear mode and a nonlinear mode of amplifier 340. As can be seen from the values in Table 1, the drain bias voltage and the gate bias voltage may be significantly higher in the nonlinear mode. The specific values included in Table 1 are exemplary and the actual applied values may differ. For example, the applied values may differ from the values of Table 1 by ±10%.

TABLE 1

| Parameter | Linear Mode | Nonlinear Mode |
| --- | --- | --- |
| Load at drain (RL) | 60 ohms | 60 ohms |
| Drain DC Voltage ($V_{dc}$) | 9 V | 20 V |
| $V_{min}$ | 1 V | 1 V |
| Power output | 0.5 W | 3 W |
| Drain DC Current $I_{dc}$ | 140 mA | 215 mA |
| Efficiency | 40% | 70% |
| Gate Bias Voltage $V_{gdc}$ | −1 V | −3 V |

Power amplifiers used in mobile communication devices may be based on various gallium arsenide (GaAs) heterojunction transistors. Devices based on GaAs may not operate at such high voltages. For example, given that $V_{min}$ of GaAs devices may be on the order of 1 V, normal operation of GaAs devices may be at 2 V in linear mode and 3 V in nonlinear mode, resulting in poor efficiencies in the linear mode.

Implementations described herein may use amplifiers that include gallium nitride (GaN) transistors. Devices based on GaN may have a higher bandgap voltage and may therefore operate at higher voltages. Therefore, GaN devices may operate with good efficiency in both the linear mode and the nonlinear mode. Using a higher voltage transistor, such as a GaN transistor, may also result in a lower current for a given power output level. The lower current may greatly reduce the inductor size in a boost converter used to create the higher voltage from a low voltage battery, making such a boost converter more feasible. This may allow the use of batteries with lower end of charge voltages than may be possible with direct operation from the batteries.

Furthermore, a lower voltage on the drain of a transistor may lead to lower impedance, which may in turn make the job of matching circuit 370 more difficult. At some point, the loss in matching circuit 370 for such large impedance transformations may wipe out any gains in battery capacity. Operating at higher voltages may lead to load impedance (RL) of approximately 50 ohms. This may mean that matching circuit 370 does not have to transform the low impedance of about 2 ohms, which may be typical of GaAs devices, to 50 ohms. A higher voltage operation (e.g., by using GaN devices), may lead to a load impedance near 50 ohms, thus requiring no impedance transformation. Thus, matching circuit 370 may only need to filter output signal 380 for optimum impedance matching. Matching circuit 370 may just resonate the drain to source capacitance, since no transformation of the real component of the impedance may be required.

CONCLUSION

The foregoing description provides illustration and description, but is not intended to be exhaustive or to limit the invention to the precise form disclosed. Modifications and variations are possible in light of the above teachings or may be acquired from practice of the invention.

For example, while series of blocks have been described with respect to FIGS. 6-9, the order of the blocks may be modified in other implementations. Further, non-dependent blocks may be performed in parallel.

It will be apparent that aspects, as described above, may be implemented in many different forms of software, firmware, and hardware in the implementations illustrated in the figures. The actual software code or specialized control hardware used to implement these aspects should not be construed as limiting. Thus, the operation and behavior of the aspects were described without reference to the specific software code—it being understood that software and control hardware could be designed to implement the aspects based on the description herein.

It should be emphasized that the term "comprises/comprising" when used in this specification is taken to specify the presence of stated features, integers, steps, or components, but does not preclude the presence or addition of one or more other features, integers, steps, components, or groups thereof.

Even though particular combinations of features are recited in the claims and/or disclosed in the specification, these combinations are not intended to limit the disclosure of the invention. In fact, many of these features may be combined in ways not specifically recited in the claims and/or disclosed in the specification.

No element, act, or instruction used in the description of the present application should be construed as critical or essential to the invention unless explicitly described as such. Also, as used herein, the article "a" is intended to include one or more items. Where only one item is intended, the term "one" or similar language is used. Further, the phrase "based on," as used herein is intended to mean "based, at least in part, on" unless explicitly stated otherwise.

What is claimed is:
1. A device comprising:
 a drain bias controller to receive an envelope signal associated with an input signal and to adjust a drain bias based on the received envelope signal;
 a gate bias controller to adjust a gate bias of the amplifier based on the received envelope signal;
 a predistortion controller to predistort the input signal, based on the received envelope signal, based on the adjusted gate bias and based on the adjusted drain bias, and to output the predistorted signal; and an amplifier to receive the predistorted signal and to generate an amplified output signal from the predistorted signal, where the adjusted drain bias is associated with the amplifier.

2. The device of claim 1, further comprising:
an envelope detector to generate the envelope signal from the input signal.

3. The device of claim 1, where the amplifier is selectable to be operated in a linear mode or in a nonlinear mode.

4. The device of claim 3, where the drain bias controller includes a first mode selector to receive a mode signal indicating whether the amplifier is to operate in the linear mode or the nonlinear mode and to cause the amplifier to operate according to the received mode signal, and where the gate bias controller includes a second mode selector to receive the mode signal and to cause the amplifier to operate according to the received mode signal.

5. The device of claim 4, where the first mode selector and the second mode selector cause the amplifier to operate in a nonlinear mode by applying an offset bias.

6. The device of claim 1, where the predistortion controller predistorts the input signal by adjusting an amplitude of the input signal and a phase of the input signal.

7. The device of claim 1, where the predistortion controller comprises:
a memory to store lookup tables; and
a processor to adjust the amplitude and the phase of the input signal based on information stored in the lookup tables.

8. The device of claim 7, where the matching circuit is further to resonate a drain capacitance associated with the amplifier at an operating frequency of the amplifier, and where the matching circuit includes an electronically tunable variable capacitor to tune the matching circuit to the operating frequency of the amplifier.

9. The device of claim 1, further comprising:
a matching circuit to match an impedance of the amplifier with a load impedance associated with the amplified output signal.

10. The device of claim 1, where the amplifier comprises one or more gallium nitride transistors.

11. The device of claim 1, where the device comprises a radio frequency transceiver of a mobile communication device.

12. A method performed by an electronic device, comprising:
receiving, using a communication interface of the electronic device, an input signal;
receiving, using the communication interface, an envelope signal associated with the received input signal;
adjusting, using the communication interface, a drain bias voltage of an amplifier associated with the communication interface, based on the envelope signal;
adjusting, using the communication interface, a gate bias voltage based on the envelope signal;
generating, using the communication interface, a predistortion signal from the received input signal, based on the envelope signal, based on the adjusted gate bias voltage and based on the adjusted drain bias voltage;
amplifying, using the amplifier, the predistortion signal; and
transmitting, using the communication interface, the amplified predistortion signal.

13. The method of claim 12, where generating the predistortion signal comprises:
receiving the envelope signal, the adjusted drain bias voltage, and the adjusted gate bias voltage;
determining an amplitude shift and a phase shift associated with the received envelope signal, the received adjusted drain bias voltage, and the received adjusted gate bias voltage; and
applying the determined amplitude shift and the determined phase shift to the received input signal.

14. The method of claim 13, where the determining the amplitude shift and the phase shift comprises reading a memory that associates the received envelope signal, the received adjusted drain bias voltage, and the received adjusted gate bias voltage with the amplitude shift and the phase shift.

15. The method of claim 13, further comprising:
receiving a mode signal; and
selecting an operating mode for the amplifier based on the mode signal.

16. The method of claim 15, where the mode signal indicates whether the amplifier is to operate in a linear mode or in a nonlinear mode, the method further comprising:
determining that the amplifier is to operate in a nonlinear mode; and
applying a gate offset bias to the amplifier, based on determining that the amplifier is to operate in the nonlinear mode.

17. The method of claim 16, where the gate offset bias is −3 Volts.

18. A system comprising a non-transitory computer-readable memory and processor logic to:
receive an input signal;
determine an envelope signal based on the received input signal;
adjust a drain bias voltage based on the envelope signal;
adjust a gate bias voltage based on the envelope signal;
generate a predistortion signal from the received input signal, based on the envelope signal, based on the adjusted drain bias voltage, and based on the adjusted gate bias voltage;
the system further comprising means for amplifying the predistortion signal;
the processor logic further to:
select whether the means for amplifying is to operate in a linear or a nonlinear mode by providing an offset for the gate bias voltage; and
transmit the amplified predistortion signal.

* * * * *